(12) United States Patent
Yoshida et al.

(10) Patent No.: US 6,914,455 B2
(45) Date of Patent: Jul. 5, 2005

(54) SIGNAL AMPLITUDE LIMITING CIRCUIT AND FILTER CIRCUIT

(75) Inventors: Yoshikazu Yoshida, Hyogo (JP); Akira Horikawa, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/340,599

(22) Filed: Jan. 13, 2003

(65) Prior Publication Data

US 2003/0132793 A1 Jul. 17, 2003

Related U.S. Application Data

(60) Provisional application No. 60/348,356, filed on Jan. 16, 2002.

(51) Int. Cl.[7] .................................................. H03K 5/22
(52) U.S. Cl. ............................ 327/65; 327/67; 330/258
(58) Field of Search ............................... 327/65, 67, 89, 327/563; 330/258

(56) References Cited

U.S. PATENT DOCUMENTS

| | | | | |
|---|---|---|---|---|
| 5,612,648 A | * | 3/1997 | McClellan et al. | 330/253 |
| 5,936,466 A | * | 8/1999 | Andoh et al. | 330/253 |
| 6,107,882 A | * | 8/2000 | Gabara et al. | 330/253 |

* cited by examiner

*Primary Examiner*—Kenneth B. Wells
(74) *Attorney, Agent, or Firm*—Volentine Francos & Whitt, PLLC

(57) ABSTRACT

A signal amplitude limiting circuit includes a differential circuit, a feed back circuit and a voltage supply circuit. The differential circuit has a positive input terminal, a negative input terminal, a positive output terminal and a negative output terminal. The feedback circuit is connected to the differential circuit. The feedback circuit compares voltages at the positive and negative output terminals with a reference voltage and outputs a comparison signal in response to the comparison. The voltage supply circuit is connected to the differential circuit and the feedback circuit. The voltage supply circuit provides a current to the differential circuit in response to the comparison signal.

18 Claims, 3 Drawing Sheets

SIGNAL AMPLITUDE LIMITING CIRCUIT AND FILTER CIRCUIT

CROSS-REFERENCE TO RELATED APPLICATIONS

A claim of priority is made to U.S. Provisional Application Ser. No. 60/348,356, filed Jan. 16, 2002.

BACKGROUND OF THE INVENTION

The invention relates to a signal amplitude limiting circuit and a filter circuit that are for instance suitable for circuit-integration.

One conventional filter circuit using transconductance amplifier is disclosed in Japanese Patent Publication No. 11-004139.

The above filter circuit is composed of a transconductance amplifier and a capacitor. The transconductance amplifier (which is referred to as a voltage control current source in the above-described official gazette) is replaced with the inductor and resistance portions in a double terminated LC ladder filter circuit. The characteristic of the filter circuit is maintained by adjusting a transconductance (gm) of the transconductance amplifier in response to a variation due to the temperature and an irregularity of element values occurred during circuit-integration.

However, the above-described conventional filter circuit has a transconductance amplifier connected directly to an input terminal, so that it has the problem that the operations of the filter circuit might not be carried out or may become unstable when an input signal to the filter circuit has a voltage amplitude that exceeds the input dynamic range of the transconductance amplifier.

On account of this, there is required a filter circuit with a transconductance amplifier which be relied upon to provide stable operation even when an input signal has a large voltage amplitude, and a signal amplitude limiting circuit suitable for the application to such filter circuit.

SUMMARY OF THE INVENTION

A signal amplitude limiting circuit of the present invention includes a differential circuit, a feed back circuit and a voltage supply circuit. The differential circuit has a positive input terminal, a negative input terminal, a positive output terminal and a negative output terminal. The feedback circuit is connected to the first differential circuit. The feedback circuit compares voltages at the positive and negative output terminals with a reference voltage and outputs a comparison signal in response to the comparison. The voltage supply circuit is connected to the differential circuit and the feedback circuit. The first voltage supply circuit provides a current to the differential circuit in response to the comparison signal.

Further, a filter circuit of the present invention has a filter circuit main unit and a signal amplitude limiting circuit. The filter circuit main unit utilizes transconductance amplifiers at least in its input stage. The signal amplitude limiting circuit generates an output signal having its voltage amplitude limited below the input dynamic range. The signal amplitude limiting circuit provides the output signal to the filter circuit main unit.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

A first embodiment of a filter circuit according to the invention is described below with reference to the drawings. The first embodiment shows the basic configuration of a filter circuit according to the invention.

Figure 1:
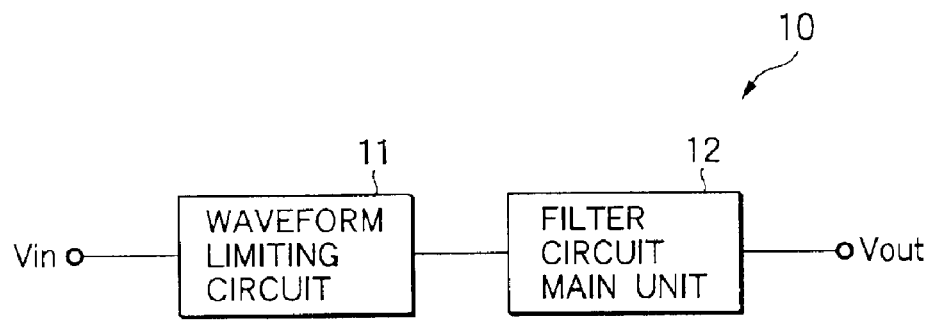
FIG. 1 is a block diagram showing a configuration of a filter circuit of the first embodiment.

FIG. 1 is a block diagram showing a configuration of the filter circuit 10 of the first embodiment. In FIG. 1, the filter circuit 10 of the first embodiment includes an input terminal Vin, a signal amplitude limiting circuit 11, a filter circuit main unit 12, and an output terminal Vout, which are provided therein in this order.

When the voltage amplitude of an input signal from the input terminal Vin exceeds the input dynamic range of an input-stage transconductance amplifier in the filter circuit main unit 12, the signal amplitude limiting circuit 11 generates an output signal having its voltage amplitude limited below the input dynamic range and supplies it to the filter circuit main unit 12. The signal amplitude limiting circuit 11 has, for example, a gain of 1, i.e. it has no amplification function.

Although the illustration of details of the filter circuit main unit 12 is omitted, it utilizes transconductance amplifiers and it has a transconductance amplifier provided at least in its input stage. Incidentally, if the above-described conditions are satisfied, the filter circuit is not limited to the configuration mentioned in the section of Prior Art.

In the case of the first embodiment (the same is true for the embodiments thereafter), it is intended that the voltage direction of the input signal from the input terminal Vin be meaningless (e.g. a signal subjected to frequency modulation or phase modulation).

Next, operations of the filter circuit 10 of the first embodiment are described.

When the voltage amplitude of an input signal from the input terminal Vin does not exceed the input dynamic range of the input-stage transconductance amplifier in the filter circuit main unit 12, the signal amplitude limiting circuit 11 allows the input signal to pass through as is and outputs the input signal to the filter circuit main unit 12. Then, the filter circuit main unit 12 performs the filtering of the input signal and outputs the filtered signal from the output terminal Vout.

On the contrary, when the voltage amplitude of an input signal from the input terminal Vin exceeds the input dynamic range of the input-stage transconductance amplifier in the filter circuit main unit 12, the signal amplitude limiting circuit 11 limits a voltage amplitude of the input signal within the input dynamic range of the transconductance amplifier and outputs the amplitude-limited input signal to the filter circuit main unit 12. Then, the filter circuit main unit 12 performs the filtering of the amplitude-limited input signal and outputs the filtered signal from the output terminal Vout.

According to the first embodiment, a signal which does not exceed the input dynamic range is always applied to the filter circuit main unit, which ensures the proper operation of the filter circuit. Also, the need when entering input signals into a filter circuit to take notice of voltage amplitudes of the input signals supplied to the filter circuit from the outside is eliminated.

The second embodiment of a signal amplitude limiting circuit and a filter circuit according to the invention is described below with reference to the drawing. The filter circuit of the second embodiment is of positive/negative complementary inputs and positive/negative complementary outputs type.

General configuration and operations of the filter circuit according to the second embodiment will be described.

Figure 2:
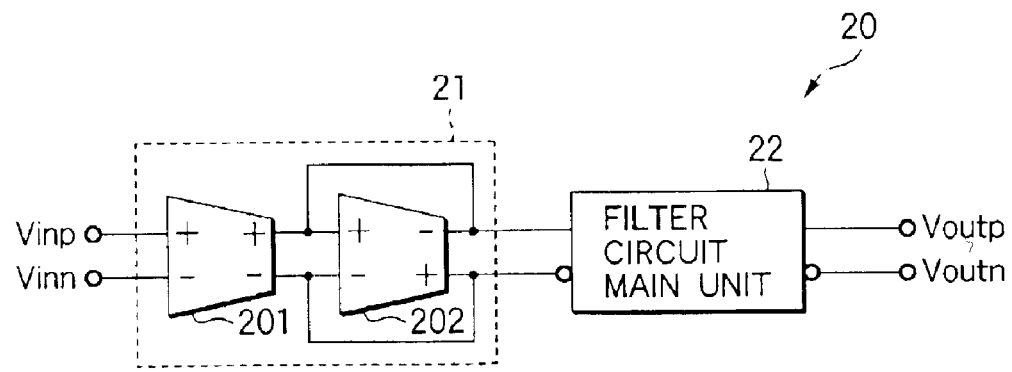
FIG. 2 is a block diagram showing a general configuration of a filter circuit of the second embodiment.

FIG. 2 is a block diagram showing a configuration of the filter circuit 20 of the second embodiment. In FIG. 2, the filter circuit 20 of the second embodiment includes positive/negative input terminals Vinp and Vinn, a signal amplitude limiting circuit 21 (which is a signal amplitude limiting circuit in the second embodiment), a filter circuit main unit 22, and positive/negative output terminals Voutp and Voutn, which are provided therein in this order.

The signal amplitude limiting circuit 21 has an amplitude-limiting transconductance amplifier 201 for applying the limitation to the amplitude of an input signal (see FIG. 3 and FIG. 4) and a current-to-voltage converting transconductance amplifier 202. The amplitude-limiting transconductance amplifier 201 and the current-to-voltage converting transconductance amplifier 202 have the same gm value (transconductance value).

The amplitude-limiting transconductance amplifier 201 has its positive/negative input terminals connected to the positive/negative input terminals Vinp and Vinn of the filter circuit 20 and applies to the input signal entered from the positive/negative input terminals Vinp and Vinn an amplitude limitation which takes into account the input dynamic range of the filter circuit main unit 22.

The positive output terminal of the amplitude-limiting transconductance amplifier 201 is connected to the positive input terminal and the negative output terminal of the current-to-voltage converting transconductance amplifier 202 and the positive input terminal of the filter circuit main unit 22. The negative output terminal of the amplitude-limiting transconductance amplifier 201 is connected to the negative input terminal and the positive output terminal of the current-to-voltage converting transconductance amplifier 202 and the negative input terminal of the filter circuit main unit 22.

Because the electric signal amplitude limited by the amplitude-limiting transconductance amplifier 201 is a current signal, the current-to-voltage converting transconductance amplifier 202 which converts a current signal to a voltage signal and enters the resultant signal into the filter circuit main unit 22 is provided.

In the case of the foregoing first embodiment, the configuration of the signal amplitude limiting circuit 11 is not limited; however, in the case of the second embodiment, the signal amplitude limiting circuit 21 includes a amplitude-limiting transconductance amplifier 201 and a current-to-voltage converting transconductance amplifier 202 with such structure that the signal amplitude limiting circuit 21 can be formed together with the filter circuit main unit 22 on one integrated circuit.

For example, the filter circuit main unit 22 includes the same transconductance amplifier as the current-to-voltage converting transconductance amplifier 202 and performs the filtering of an amplitude-limited input voltage signal converted by the current-to-voltage converting transconductance amplifier 202. The positive output terminal of the filter circuit main unit 22 is connected to the positive output terminal Voutp of the total filter circuit 20. The negative output terminal of the filter circuit main unit 22 is connected to the negative output terminal Voutn of the total filter circuit 20.

The filter circuit 20 of the second embodiment operates as follows.

An input signal (voltage signal) from the positive/negative input terminals Vinp and Vinn is limited in amplitude by the amplitude-limiting transconductance amplifier 201, taking the input dynamic range of the filter circuit main unit 22 into account; the amplitude-limited signal (current signal) is converted into a voltage signal by the current-to-voltage converting transconductance amplifier 202, applied to the filter circuit main unit 22, filtered by the filter circuit main unit 22, and output from the positive/negative output terminal Voutp and the negative output terminal Voutn.

Configuration and operations of the amplitude-limiting transconductance amplifier 201 according to the first embodiment will be described with reference to FIG. 3.

Figure 3:
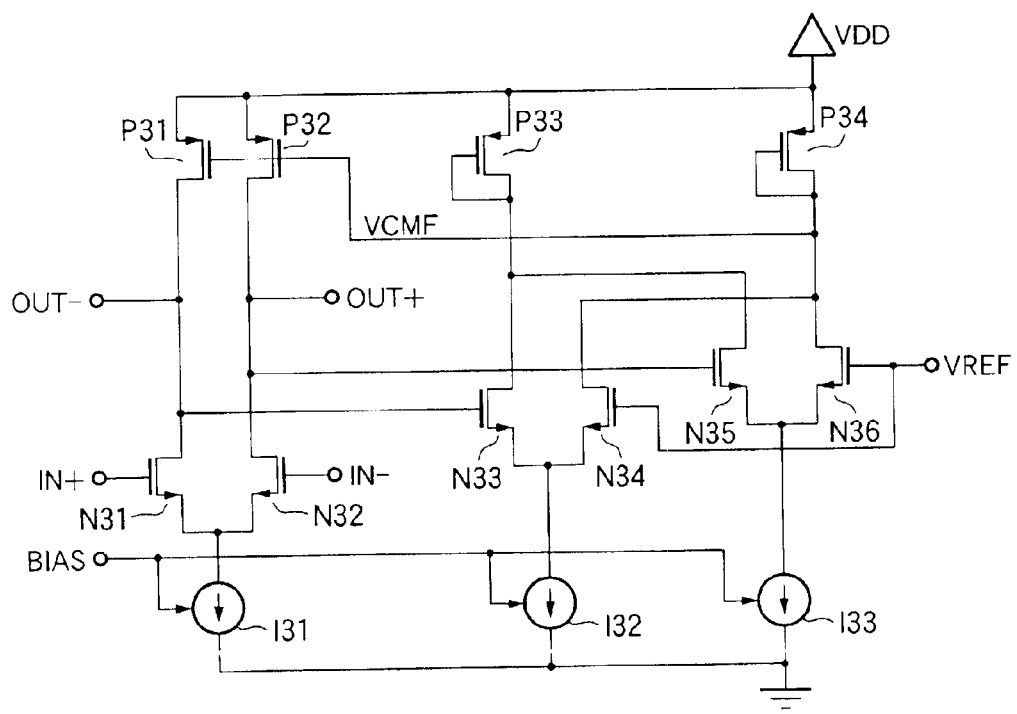
FIG. 3 is a circuit diagram showing a first embodiment of an amplitude-limiting transconductance amplifier of the second embodiment.

FIG. 3 is a circuit diagram showing the first embodiment of the amplitude-limiting transconductance amplifier 201.

In FIG. 3, two NMOS transistors N31 and N32 are connected to each other at their sources to form a differential pair and the gates of the NMOS transistors N31 and N32 are connected to input terminals IN+ and IN− respectively; and their common source is connected to a current source 131.

A PMOS transistor P31 has its drain connected to the negative output terminal OUT− and to the drain of the NMOS transistor N31 and has its source connected to the power supply terminal VDD. The PMOS transistor P32 has its drain connected to the positive output terminal OUT+ and to the drain of the NMOS transistor N32 and has its source connected to the power supply terminal VDD. The PMOS transistors P31 and P32 generate currents which are affected by the drain voltage of the NMOS transistors N31 and N32 (i.e. input potential). In addition, two NMOS transistors N33 and N34 are connected to each other at their sources to form a differential pair and the common source thereof is connected to a current source I32. One NMOS transistor N33 has a gate connected to the drain of the NMOS transistor N31 and the other NMOS transistor N34 has a gate connected to a reference voltage input terminal VREF.

The differential pair of the NMOS transistors N33 and N34 is formed to control the direct current level of the output terminal OUT−.

Two NMOS transistors N35 and N36 are connected to each other at their sources to form a differential pair and the common source is connected to a current source I33. One NMOS transistor N35 has a gate connected to the drain of the NMOS transistor N32 and the other NMOS transistor N36 has a gate connected to a reference voltage input terminal VREF.

The differential pair of the NMOS transistors N35 and N36 is formed to control a direct current level of the output terminal OUT+.

A PMOS transistor P33 has its gate and its drain connected to each other and to the drain of the NMOS transistor N33 and to the drain of the NMOS transistor N35, and has its source connected to the power supply terminal VDD. The PMOS transistor P33 also acts as a load for the NMOS transistors N33 and N35.

In addition, the PMOS transistor P34 has its gate and its drain connected to each other and to the drain of the NMOS transistor N34 and to the drain of the NMOS transistor N36, and has its source connected to the power supply terminal VDD. The PMOS transistor P34 also acts as a load for the NMOS transistors N34 and N36.

Gates of the foregoing PMOS transistors P31 and P32 are connected to the drain of the PMOS transistor P34.

Each of the terminal, opposite their common source, of the current sources I31, I32, I33 is connected to the ground. Also, each of the current sources I31, I32, I33 is a variable constant current source, in which its control terminal is connected to a current regulating terminal BIAS. While constant currents by the current sources I31, I32, I33 are intended to be identical, it is acceptable if they are different.

Next, operations of the first embodiment of the amplitude-limiting transconductance amplifier 201 of the first embodiment will be described.

For example, when signals of an identical potential (which is a direct current level at which the transconductance amplifier 201 can operate normally) are applied to the positive/negative input terminals IN+ and IN−, all the currents provided by the PMOS transistors P31 and P32 flow to the NMOS transistors N31 and N32, respectively.

On the contrary, for example, when different signals (complementary signals), for example, an H level signal for the positive input terminal IN+ and an L level signal for the negative input terminal IN−, are applied, the NMOS transistor N31 provides a current larger than that which the PMOS transistor P31 provides, and draws the difference in current from outside the transconductance amplifier 201 through the output terminal OUT−. In addition, the NMOS transistor N32 provides a current smaller than that which the PMOS transistor P32 provides and excess current is discharged to outside of the transconductance amplifier 201 through the output terminal OUT+. The ratio of the voltage amplitude (Vin) of the differential signal provided from the positive/negative input terminals IN+ and IN− to the value of the current (Iout) discharged to or drawn from the outside through the positive/negative output terminals OUT+ and OUT− (Iout/Vin) is the gm value.

The amount of current discharged to or drawn through the positive/negative output terminals OUT+ and OUT− are determined and limited by the amount of current generated by the current source I31 and amount of current provided by the PMOS transistors P31 and P32, i.e. the sizes of the PMOS transistors P31 and P32. Thus the limitation of amplitude is carried out.

What determines the direct current levels at the positive/negative output terminals OUT+ and OUT− is the feedback circuit on the right side. When the reference voltage input terminal VREF supplies a direct current level such that the transconductance amplifier 201 can operate normally, the positive/negative output terminals OUT+ and OUT− reach the same direct current level as a reference voltage VREF.

For example, when the direct current levels at the positive/negative output terminals OUT+ and OUT− are less than a reference voltage VREF, the NMOS transistors N33, N35 suppress current and the current generated by the PMOS transistor P33 decreases. The NMOS transistors N34, N36 provide current which is increased by as much as the decrease in the current provided by NMOS transistors N33, N35, and therefore the current that the PMOS transistor P34 provides increased current. Because the PMOS transistor P34 is diode-connected, an increase in current increases voltage between the drain and source and lowers the applied potentials VCMF to the gates of the PMOS transistors P31 and P32, thereby increasing the currents provided by the PMOS transistors P31 and P32 and raising the direct current levels at the positive/negative output terminals OUT+ and OUT−.

Conversely, when the direct current levels at the positive/negative output terminals OUT+ and OUT− are higher than the reference voltage VREF, the potentials VCMF applied to the gates of the PMOS transistors P31 and P32 rise and the currents provided by the PMOS transistors P31 and P32 decrease, thereby lowering the direct current levels at the positive/negative output terminals OUT+ and OUT−.

The feedback circuit is not affected by the voltage amplitude at the positive/negative output terminals OUT+ and OUT− and can adjust only the direct current levels.

Next, the configuration of the amplitude-limiting transconductance amplifier 201 of the second embodiment is described with reference to FIG. 4.

Figure 4:
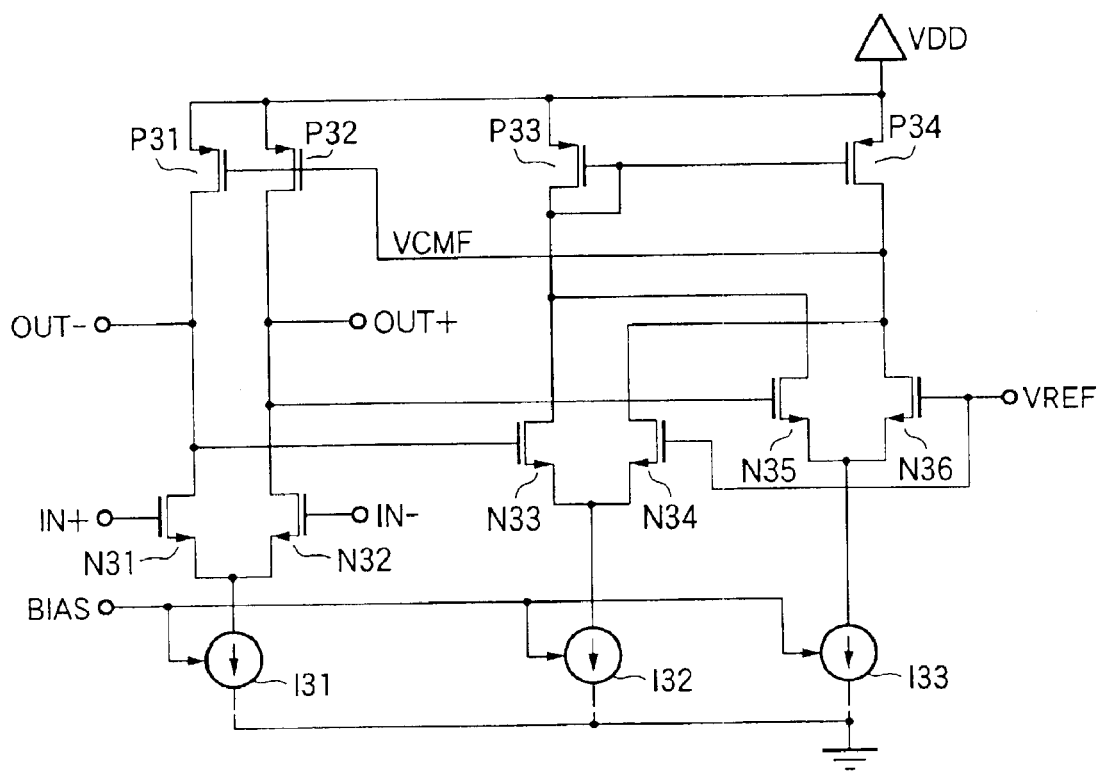
FIG. 4 is a circuit diagram showing a second embodiment of an amplitude-limiting transconductance amplifier of the second embodiment.

FIG. 4 is a circuit diagram showing the second embodiment of the amplitude-limiting transconductance amplifier 201, wherein portions similar to those of the foregoing embodiment in FIG. 3 are indicated by the same reference characters.

When the second embodiment of the amplitude-limiting transconductance amplifier 201, which is shown in FIG. 4, is compared with the first embodiment of the amplitude-limiting transconductance amplifier 201, which is shown in FIG. 3, they are different in the connection relationship between the PMOS transistors P33 and P34.

The PMOS transistor P33 has its gate and its drain connected to each other and to the gate of PMOS transistor P34. The other connections between the PMOS transistors P33 and P34 are the same as those for the first embodiment.

In other words, in the second embodiment, the PMOS transistors P33 and P34 constitute a current mirror circuit.

The operations in the second embodiment of the amplitude-limiting transconductance amplifier 201 are described below with the focus on the differences from the operations in the first embodiment.

The operations of the transconductance amplifier 201 arranged to limit the input signal are described in detail.

In the case of the foregoing first embodiment, the drain potential VCMF of the PMOS transistor P34 which is to be applied to gates of PMOS transistors P31 and P32, rises no higher than a source voltage VDD minus the threshold voltage Vth, because the PMOS transistor P34 is diode-connected. Thus, the range within which the direct current levels at the positive/negative output terminals OUT+ and OUT− can be regulated is narrow.

Therefore, in the second embodiment, the diode-connection portion in the feedback circuit in the first embodiment has been replaced with a current mirror circuit, as mentioned above.

Only the operation of the feedback circuit in the second embodiment is described below.

The reference voltage input terminal VREF is supplied with a direct current at a level which permits normal operation of the transconductance amplifier 201. For example, when the direct current levels at the positive/negative output terminals OUT+ and OUT− are less than the VREF, the NMOS transistors N33 and N35 suppress current and the current provided by the PMOS transistor P33 decreases. Because the PMOS transistors P33 and P34 constitute a current mirror circuit, the current generated by the PMOS transistor P34 also decreases. Thus, the potential VCMF lowers, so that the current generated by the PMOS transistors P31 and P32 increases and the direct current levels at the positive/negative output terminals OUT+ and OUT− rise. Conversely, when the direct current levels at the positive/negative output terminals OUT+ and OUT− are higher than the reference voltage VREF, the resulting increase in the potential VCMF causes a decrease of the currents provided by the PMOS transistors P31 and P32 and therefore the direct current levels at the positive/negative output terminals OUT+ and OUT− lower.

The feedback circuit is not affected by the voltage amplitudes at the positive/negative output terminals OUT+ and OUT− and can adjust only the direct current levels.

As stated above, the second embodiment can produce the same effect as that in the first embodiment. In other words, because signals not exceeding the input dynamic range are applied to the filter circuit main unit 21 at all times, the proper operation of the filter circuit 20 is ensured, and also there is no need when entering input signals into the filter circuit 20 to take notice of voltage amplitudes of the input signals supplied to the filter circuit from the outside.

Further, according to the second embodiment, the amplitude-limiting transconductance amplifier 201 shown in FIG. 3 or FIG. 4 is applied, so that it is possible to regulate the direct current level of input signals to the filter circuit main unit 22 (specifically, shown in FIG. 4).

Although the transconductance amplifier 201 constituted with MOS transistors has been described for the above-described second embodiment, the same effect can be obtained even when it is constituted by other type unipolar transistors or bipolar transistors. In addition, the conductivity types (N-type, P-type) may be mutually replaced with those shown in FIG. 3 or FIG. 4 to constitute the transconductance amplifier 201.

In addition, although a configuration according to differential signals is adopted in the second embodiment, a single-end configuration may be adopted, for example, by grounding one of the inputs and one of the outputs, and the same effect can be obtained.

Further, although the transconductance amplifier has been arranged to limit input signals only for the transconductance amplifier 201 in the second embodiment, as shown in FIG. 2, a transconductance amplifier in the transconductance amplifier 202 or filter circuit 22 also may be arranged like the transconductance amplifier 201.

According to the invention, it is possible to provide a signal amplitude limiting circuit suitable for an application to a filter circuit with a transconductance amplifier which can be relied upon to provide stable operation even when the voltage amplitude of an input signal is large.

In addition, according to the invention, it is possible to achieve a filter circuit with a transconductance amplifier which can be relied upon to provide stable operations even when the voltage amplitude of an input signal is large.

What is claimed is:

1. A signal amplitude limiting circuit comprising:
a first differential circuit having a positive input terminal, a negative input terminal, a positive output terminal and a negative output terminal;
a feedback circuit connected to the first differential circuit, the feedback circuit comparing voltages at the positive and negative output terminals with a reference voltage received thereto and outputting a comparison signal in response to the comparison thereof; and
a first voltage supply circuit connected to the first differential circuit and the feedback circuit, the first voltage supply circuit providing a current to the first differential circuit in response to the comparison signal,
wherein the feedback circuit includes
a second differential circuit having a first input terminal connected to the positive output terminal of the first differential circuit and a second input terminal connected to receive the reference voltage, the second differential circuit comparing voltage at the positive output terminal of the first differential circuit with the reference voltage and providing a current in response to the comparison thereof,
a third differential circuit having a first input terminal connected to the negative output terminal of the first differential circuit and a second input terminal connected to receive the reference voltage, the third differential circuit comparing voltage at the negative output terminal of the first differential circuit with the reference voltage and providing a current in response to the comparison thereof, and
a second voltage supply circuit connected to the second and third differential circuits, the second voltage supply circuit providing a current to the second and third differential circuits based on the currents provided by the second and third differential circuits and generating the comparison signal in response to the current provided thereof,
wherein the second differential circuit includes a first MOS transistor having a gate connected to the first input terminal of the second differential circuit, a drain and a source, and a second MOS transistor having a gate connected to the second input terminal of the second differential circuit, a drain and a source connected to the source of the first MOS transistor, and
wherein the third differential circuit includes a third MOS transistor having a gate connected to the first input terminal of the third differential circuit, a drain connected to the drain of the first MOS transistor and a source, and a fourth MOS transistor having a gate connected to the second input terminal of the third differential circuit, a drain connected to the drain of the second MOS transistor and a source connected to the source of the third MOS transistor, and
wherein the second voltage supply circuit includes a fifth MOS transistor having a source connected to a first potential source, and a gate and a drain connected to the drains of the first and third MOS transistors, and a sixth MOS transistor having a source connected to the first potential source, and a gate and a drain connected to the drains of the second and fourth MOS transistors.

2. A signal amplitude limiting circuit according to claim 1, wherein the first differential circuit includes a seventh MOS transistor having a gate connected to the positive input terminal, a drain connected to the negative output terminal and a source, and an eighth MOS transistor having a gate connected to the negative input terminal, a drain connected to the positive output terminal and a source connected to the source of the seventh MOS transistor.

3. A signal amplitude limiting circuit according to claim 2, wherein the first voltage supply circuit includes a ninth MOS transistor having a gate connected to receive the comparison signal, a source connected to a first potential source and a drain connected to the drain of the seventh MOS transistor, and a tenth MOS transistor having a gate connected to receive the comparison signal, a source connected to the first potential source and a drain connected to the drain of the eighth MOS transistor.

4. A filter circuit comprising:
a signal amplitude limiting circuit having a positive input terminal, a negative input terminal, a positive output terminal and a negative output terminal, the signal amplitude limiting circuit includes
an amplitude-limiting transconductance amplifier having a positive input terminal connected to the positive input terminal of the signal amplitude limiting circuit, a negative input terminal connected to the negative input terminal of the signal amplitude limiting circuit, a positive output terminal and a negative output terminal, the amplitude-limiting transconductance amplifier having a first transconductance value, and
a current-to-voltage converting transconductance amplifier having a positive input terminal connected to the positive output terminal of the amplitude-limiting transconductance amplifier, a negative input terminal connected to the negative output terminal of the amplitude-limiting transconductance amplifier, a positive output terminal connected to the negative input terminal thereof and the positive output terminal of the signal amplitude limiting circuit, and a negative output terminal connected to the positive input terminal thereof and the negative output terminal of the signal amplitude limiting circuit, the current-to-voltage converting transconductance amplifier having the first transconductance value; and
a filter circuit main unit having a positive input terminal connected to the negative output terminal of the signal amplitude limiting circuit, a negative input terminal connected to the positive output terminal of the signal amplitude limiting circuit, a positive output terminal and a negative output terminal,
wherein the amplitude-limiting transconductance amplifier includes
a first differential circuit having a positive input terminal connected to the positive input terminal of the amplitude-limiting transconductance amplifier, a negative input terminal connected to the negative input terminal of the amplitude-limiting transconductance amplifier, a positive output terminal connected to the positive output terminal of the amplitude-limiting transconductance amplifier and a negative output terminal connected to the negative output terminal of the amplitude-limiting transconductance amplifier,
a feedback circuit connected to the first differential circuit, the feedback circuit comparing voltages at the positive and negative output terminals with a reference voltage received thereto and outputting a comparison signal in response to the comparison thereof, and
a first voltage supply circuit connected to the first differential circuit and the feedback circuit, the first voltage supply circuit providing a current to the first differential circuit in response to the comparison signal, and
wherein the feedback circuit includes
a second differential circuit having a first input terminal connected to the positive output terminal of the first differential circuit and a second input terminal connected to receive the reference voltage, the second differential circuit comparing voltage at the positive output terminal of the first differential circuit with the reference voltage and providing a current in response to the comparison thereof,
a third differential circuit having a first input terminal connected to the negative output terminal of the first differential circuit and a second input terminal connected to receive the reference voltage, the third differential circuit comparing voltage at the negative output terminal of the first differential circuit with the reference voltage and providing a current in response to the comparison thereof, and
a second voltage supply circuit connected to the second and third differential circuits, the second voltage supply circuit providing a current to the second and third differential circuits based on the currents provided by the second and third differential circuits and generating the comparison signal in response to the current provided thereof.

5. A filter circuit according to claim 4, wherein the first differential circuit includes a first MOS transistor having a gate connected to the positive input terminal, a drain connected to the negative output terminal and a source, and a second MOS transistor having a gate connected to the negative input terminal, a drain connected to the positive output terminal and a source connected to the source of the first MOS transistor.

6. A filter circuit according to claim 4, wherein the second differential circuit includes a first MOS transistor having a gate connected to the first input terminal of the second differential circuit, a drain and a source, and a second MOS transistor having a gate connected to the second input terminal of the second differential circuit, a drain and a source connected to the source of the first MOS transistor, and wherein the third differential circuit includes a third MOS transistor having a gate connected to the first input terminal of the third differential circuit, a drain connected to the drain of the first MOS transistor and a source, and a fourth MOS transistor having a gate connected to the second input terminal of the third differential circuit, a drain connected to the drain of the second MOS transistor and a source connected to the source of the third MOS transistor.

7. A filter circuit according to claim 5, wherein the first voltage supply circuit includes a third MOS transistor having a gate connected to receive the comparison signal, a source connected to a first potential source and a drain connected to the drain of the first MOS transistor, and a fourth MOS transistor having a gate connected to receive the comparison signal, a source connected to the first potential source and a drain connected to the drain of the second MOS transistor.

8. A filter circuit according to claim 6, wherein the second voltage supply circuit includes a fifth MOS transistor having a source connected to a first potential source, and a gate and a drain connected to the drains of the first and third MOS transistors, and a sixth MOS transistor having a source connected to the first potential source, and a gate and a drain connected to the drains of the second and fourth MOS transistors.

9. A filter circuit according to claim 6, wherein the second voltage supply circuit includes a fifth MOS transistor having a source connected to a first potential source, and a gate and a drain connected to the drains of the first and third MOS transistors, and a sixth MOS transistor having a source connected to the first potential source, a gate connected to the gate of the fifth MOS transistor and a drain connected to the drains of the second and fourth MOS transistors.

10. A signal amplitude limiting circuit comprising:
a first differential circuit having a positive input terminal, a negative input terminal, a positive output terminal and a negative output terminal;
a feedback circuit connected to the first differential circuit, the feedback circuit comparing a voltage at the positive output terminal with a reference voltage received thereto to provide a first comparison result, comparing a voltage at the negative output terminal with the reference voltage to provide a second comparison result, and outputting a comparison signal responsive to the first and second comparison results; and
a first voltage supply circuit connected to the first differential circuit and the feedback circuit, the first voltage supply circuit providing a current to the first differential circuit in response to the comparison signal,
wherein the feedback circuit includes
a second differential circuit having a first input terminal connected to the positive output terminal of the first differential circuit and a second input terminal connected to receive the reference voltage, the second differential circuit comparing the voltage at the positive output terminal of the first differential circuit with the reference voltage and providing a first current responsive to the first comparison result,
a third differential circuit having a first input terminal connected to the negative output terminal of the first differential circuit and a second input terminal connected to receive the reference voltage, the third differential circuit comparing the voltage at the negative output terminal of the first differential circuit with the reference voltage and providing a second current responsive to the second comparison result, and
a second voltage supply circuit connected to the second and third differential circuits, the second voltage supply circuit providing a current to the second and third differential circuits, and generating the comparison signal, based on the first and second currents provided by the second and third differential circuits,
wherein the second differential circuit includes a first MOS transistor having a gate connected to the first input terminal of the second differential circuit, a drain and a source, and a second MOS transistor having a gate connected to the second input terminal of the second differential circuit, a drain and a source connected to the source of the first MOS transistor, and
wherein the third differential circuit includes a third MOS transistor having a gate connected to the first input terminal of the third differential circuit, a drain connected to the drain of the first MOS transistor and a source, and a fourth MOS transistor having a gate connected to the second input terminal of the third differential circuit, a drain connected to the drain of the second MOS transistor and a source connected to the source of the third MOS transistor, and
wherein the second voltage supply circuit includes a fifth MOS transistor having a source connected to a first potential source, and a gate and a drain connected to the drains of the first and third MOS transistors, and a sixth MOS transistor having a source connected to the first potential source, and a gate and a drain connected to the drains of the second and fourth MOS transistors.

11. A signal amplitude limiting circuit according to claim 10, wherein the first differential circuit includes a seventh MOS transistor having a gate connected to the positive input terminal, a drain connected to the negative output terminal and a source, and an eighth MOS transistor having a gate connected to the negative input terminal, a drain connected to the positive output terminal and a source connected to the source of the seventh MOS transistor.

12. A signal amplitude limiting circuit according to claim 11, wherein the first voltage supply circuit includes a ninth MOS transistor having a gate connected to receive the comparison signal, a source connected to a first potential source and a drain connected to the drain of the seventh MOS transistor, and a tenth MOS transistor having a gate connected to receive the comparison signal, a source connected to the first potential source and a drain connected to the drain of the eighth MOS transistor.

13. A signal amplitude limiting circuit comprising:
a first differential circuit having a positive input terminal, a negative input terminal, a positive output terminal and a negative output terminal;
a feedback circuit connected to the first differential circuit, the feedback circuit comparing voltages at the positive and negative output terminals with a reference voltage received thereto and outputting a comparison signal in response to the comparison thereof; and
a first voltage supply circuit connected to the first differential circuit and the feedback circuit, the first voltage supply circuit providing a current to the first differential circuit in response to the comparison signal,
wherein the feedback circuit includes
a second differential circuit having a first input terminal connected to the positive output terminal of the first differential circuit and a second input terminal connected to receive the reference voltage, the second differential circuit comparing voltage at the positive output terminal of the first differential circuit with the reference voltage and providing a current in response to the comparison thereof,
a third differential circuit having a first input terminal connected to the negative output terminal of the first differential circuit and a second input terminal connected to receive the reference voltage, the third differential circuit comparing voltage at the negative output terminal of the first differential circuit with the reference voltage and providing a current in response to the comparison thereof, and
a second voltage supply circuit connected to the second and third differential circuits, the second voltage supply circuit providing a current to the second and third differential circuits based on the currents provided by the second and third differential circuits and generating the comparison signal in response to the current provided thereof,
wherein the second differential circuit includes a first MOS transistor having a gate connected to the first input terminal of the second differential circuit, a drain and a source, and a second MOS transistor having a gate connected to the second input terminal of the second differential circuit, a drain and a source connected to the source of the first MOS transistor, and
wherein the third differential circuit includes a third MOS transistor having a gate connected to the first input terminal of the third differential circuit, a drain connected to the drain of the first MOS transistor and a source, and a fourth MOS transistor having a gate connected to the second input terminal of the third differential circuit, a drain connected to the drain of the second MOS transistor and a source connected to the source of the third MOS transistor, and wherein the second voltage supply circuit includes a fifth MOS transistor having a source connected to a first potential source, and a gate and a drain connected to the drains of the first and third MOS transistors, and a sixth MOS transistor having a source connected to the first potential source, a gate connected to the gate of the fifth MOS transistor and a drain connected to the drains of the second and fourth MOS transistors.

14. A signal amplitude limiting circuit according to claim 13, wherein the first differential circuit includes a seventh MOS transistor having a gate connected to the positive input terminal, a drain connected to the negative output terminal and a source, and an eighth MOS transistor having a gate connected to the negative input terminal, a drain connected to the positive output terminal and a source connected to the source of the seventh MOS transistor.

15. A signal amplitude limiting circuit according to claim 14, wherein the first voltage supply circuit includes a ninth MOS transistor having a gate connected to receive the comparison signal, a source connected to a first potential source and a drain connected to the drain of the seventh MOS transistor, and a tenth MOS transistor having a gate connected to receive the comparison signal, a source connected to the first potential source and a drain connected to the drain of the eighth MOS transistor.

16. A signal amplitude limiting circuit comprising:
a first differential circuit having a positive input terminal, a negative input terminal, a positive output terminal and a negative output terminal;
a feedback circuit connected to the first differential circuit, the feedback circuit comparing a voltage at the positive output terminal with a reference voltage received thereto to provide a first comparison result, comparing a voltage at the negative output terminal with the reference voltage to provide a second comparison result, and outputting a comparison signal responsive to the first and second comparison results; and
a first voltage supply circuit connected to the first differential circuit and the feedback circuit, the first voltage supply circuit providing a current to the first differential circuit in response to the comparison signal,
wherein the feedback circuit includes
a second differential circuit having a first input terminal connected to the positive output terminal of the first differential circuit and a second input terminal connected to receive the reference voltage, the second differential circuit comparing the voltage at the positive output terminal of the first differential circuit with the reference voltage and providing a first current responsive to the first comparison result,
a third differential circuit having a first input terminal connected to the negative output terminal of the first differential circuit and a second input terminal connected to receive the reference voltage, the third differential circuit comparing the voltage at the negative output terminal of the first differential circuit with the reference voltage and providing a second current responsive to the second comparison result, and
a second voltage supply circuit connected to the second and third differential circuits, the second voltage supply circuit providing a current to the second and third differential circuits, and generating the comparison signal, based on the first and second currents provided by the second and third differential circuits, wherein the second differential circuit includes a first MOS transistor having a gate connected to the first input terminal of the second differential circuit, a drain and a source, and a second MOS transistor having a gate connected to the second input terminal of the second differential circuit, a drain and a source connected to the source of the first MOS transistor, and wherein the third differential circuit includes a third MOS transistor having a gate connected to the first input terminal of the third differential circuit, a drain connected to the drain of the first MOS transistor and a source, and a fourth MOS transistor having a gate connected to the second in put terminal of the third differential circuit, a drain connected to the drain of the second MOS transistor and a source connected to the source of the third MOS transistor, and wherein the second voltage supply circuit includes a fifth MOS transistor having a source connected to a first potential source, and a gate and a drain connected to the drains of the first and third MOS transistors, and a sixth MOS transistor having a source connected to the first potential source, a gate connected to the gate of the fifth MOS transistor and a drain connected to the drains of the second and fourth MOS transistors.

17. A signal amplitude limiting circuit according to claim 16, wherein the first differential circuit includes a seventh MOS transistor having a gate connected to the positive input terminal, a drain connected to the negative output terminal and a source, and an eighth MOS transistor having a gate connected to the negative input terminal, a drain connected to the positive output terminal and a source connected to the source of the seventh MOS transistor.

18. A signal amplitude limiting circuit according to claim 17, wherein the first voltage supply circuit includes a ninth MOS transistor having a gate connected to receive the comparison signal, a source connected to a first potential source and a drain connected to the drain of the seventh MOS transistor, and a tenth MOS transistor having a gate connected to receive the comparison signal, a source connected to the first potential source and a drain connected to the drain of the eighth MOS transistor.

* * * * *